(12) United States Patent
Wang et al.

(10) Patent No.: US 12,395,160 B2
(45) Date of Patent: Aug. 19, 2025

(54) HIGHLY RELIABLE POSITIVE-TO-NEGATIVE VOLTAGE CONVERSION CIRCUIT

(71) Applicant: Wenzhou University, Zhejiang (CN)

(72) Inventors: Pengjun Wang, Zhejiang (CN); Xiangyu Li, Zhejiang (CN); Xiao Wei Zhang, Zhejiang (CN); Hao Ye, Zhejiang (CN); Xu Dong Wu, Zhejiang (CN)

(73) Assignee: Wenzhou University, Zhejiang (CN)

( * ) Notice: Subject to any disclaimer, the term of this patent is extended or adjusted under 35 U.S.C. 154(b) by 53 days.

(21) Appl. No.: 18/408,587

(22) Filed: Jan. 10, 2024

(65) Prior Publication Data
US 2025/0088180 A1 Mar. 13, 2025

(30) Foreign Application Priority Data
Sep. 13, 2023 (CN) .......................... 202311174539.4

(51) Int. Cl.
*H03K 3/356* (2006.01)
*H03K 19/003* (2006.01)
*H03K 19/0185* (2006.01)

(52) U.S. Cl.
CPC . *H03K 3/356113* (2013.01); *H03K 19/00315* (2013.01); *H03K 19/018521* (2013.01)

(58) Field of Classification Search
CPC ....... H03K 3/356113; H03K 19/00315; H03K 19/018521; H03K 3/356104; H03K 3/356; H03K 5/003; H03K 19/0175; H03K 19/017509; H03K 19/0185; H03K 19/017545; H03K 3/353; H03K 3/037; G06F 3/00
See application file for complete search history.

(56) References Cited

U.S. PATENT DOCUMENTS 10,200,024 B2 * 2/2019 Dai ...................... H03M 1/002

* cited by examiner

*Primary Examiner* — Jung Kim
(74) *Attorney, Agent, or Firm* — JCIPRNET

(57) ABSTRACT

The present invention discloses a highly reliable positive-to-negative voltage conversion circuit, including a first inverter, a first buffer, a second buffer, a first to seventh NMOS transistors, a first to third PMOS transistors, a first resistor, a second resistor, a third resistor, and a fourth resistor, wherein the third PMOS transistor, the third NMOS transistor, the fourth NMOS transistor, the fifth NMOS transistor, the sixth NMOS transistor and the seventh NMOS transistor form an on/off control circuit, with that a power supply path between a positive-voltage power supply terminal and a negative-voltage power supply terminal is physically isolated by the on/off control circuit to eliminate voltage reversing occurring when the positive-voltage power supply terminal and the negative-voltage power supply terminal cannot be synchronized during power-on.

7 Claims, 2 Drawing Sheets

US 12,395,160 B2

HIGHLY RELIABLE POSITIVE-TO-NEGATIVE VOLTAGE CONVERSION CIRCUIT

CROSS-REFERENCE TO RELATED APPLICATION

This application claims the priority benefit of China application no. 202311174539.4, filed on Sep. 13, 2023. The entirety of the above mentioned patent application is hereby incorporated by reference herein and made a part of this specification.

BACKGROUND

1. Technical Field

The present invention relates to a positive-to-negative voltage conversion circuit, and in particular, to a highly reliable positive-to-negative voltage conversion circuit.

2. Description of Related Art

With the continuous progress made in microelectronics design techniques and manufacturing processes, the demands for integration of a single chip with processing units having multiple power supply varieties and for integration of more digital-analog hybrid circuits have become more and more common. For example, in the field of radar emitters, it is often necessary to integrate positive-voltage power modulation and power amplifier gate drive and control on a single chip. This involves the supply of different power sources, for example, 5V (positive power source) and −5V (negative power source). However, at a system level, there is uncertainty in the power-on sequence of different power sources, in particular in a laboratory test environment, where the input TTL/CMOS control signal, positive power source, and negative power source of a drive chip may have a random power-on sequence.

In general, a traditional voltage conversion circuit consists of an input buffer stage, a level conversion stage and an output stage, and has a power supply path between its positive-voltage power supply terminal and its negative-voltage power supply terminal. When its positive-voltage power supply terminal is powered on and its negative-voltage power supply terminal is not powered on, the positive-voltage power supply terminal continues charging the negative-voltage power supply terminal by means of a power supply path therebetween, which leads to voltage reversing. Although an induced voltage at the negative-voltage power supply terminal can be limited via forward voltage drop by a diode and thus reduced due to a forward diode effect between the negative-voltage power supply terminal and the ground, it will still bring application risks to the negative-voltage power supply application at a later stage. For instance, in the case that the positive-voltage power supply terminal is a 5V power supply terminal and the negative-voltage power supply terminal is a −5V power supply terminal, when the positive-voltage power supply terminal is connected to 5V voltage and then powered on and the negative-voltage power supply terminal is not powered, an induced voltage at the negative-voltage power supply terminal is limited to around 0.5V by the forward voltage drop of the diode. That is, the negative-voltage power supply terminal induces an induced voltage of around 0.5V, which brings application risks to a negative-voltage power supply application circuit at a later stage.

SUMMARY

The technical problem to be solved by the present invention is to provide a highly reliable positive-to-negative voltage conversion circuit, in which a power supply path between a positive-voltage power supply terminal and a negative-voltage power supply terminal is physically isolated to eliminate voltage reversing occurring when the positive-voltage power supply terminal and the negative-voltage power supply terminal cannot be synchronized during power-on, thereby avoiding bringing application risks to a negative-voltage power supply application circuit at a later stage.

To solve the technical problem described above, the present invention employs the following technical solution: a highly reliable positive-to-negative voltage conversion circuit, including a first inverter, a first buffer, a second buffer, a first N-type metal-oxide-silicon (NMOS) transistor, a second NMOS transistor, a third NMOS transistor, a fourth NMOS transistor, a fifth NMOS transistor, a sixth NMOS transistor, a seventh NMOS transistor, a first P-type metal-oxide-silicon (PMOS) transistor, a second PMOS transistor, a third PMOS transistor, a first resistor, a second resistor, a third resistor, and a fourth resistor, wherein the first inverter, the first buffer and the second buffer each has an input terminal, an output terminal, a power terminal and a ground terminal; the input terminal of the first buffer is a signal input terminal of the positive-to-negative voltage conversion circuit; the power terminal of the first buffer, the power terminal of the first inverter, a source of the first PMOS transistor, a source of the second PMOS transistor and a source of the third PMOS transistor are connected at a connection terminal of a positive-voltage power supply terminal of the positive-to-negative voltage conversion circuit for connecting a positive voltage VDD; the ground terminal of the first buffer is grounded, and the output terminal of the first buffer is connected to the input terminal of the first inverter and a gate of the first PMOS transistor, respectively; the ground terminal of the first inverter is grounded, and the output terminal of the first inverter is connected to a gate of the second PMOS transistor; a drain of the first PMOS transistor is connected to a terminal of the first resistor, a drain of the second PMOS transistor is connected to a terminal of the second resistor, and the other terminal of the first resistor, a terminal of the third resistor, a drain of the first NMOS transistor and a gate of the second NMOS transistor are connected; the other terminal of the second resistor, a terminal of the fourth resistor, a drain of the second NMOS transistor, a gate of the first NMOS transistor and an input terminal of the second buffer are connected; the other terminal of the third resistor is connected to a drain of the third NMOS transistor; the other terminal of the fourth resistor is connected to a drain of the sixth NMOS transistor; a source of the first NMOS transistor is connected to a drain of the fourth NMOS transistor; a source of the second NMOS transistor is connected to a drain of the fifth NMOS transistor; a drain of the seventh NMOS transistor, a gate of the third NMOS transistor, a gate of the fourth NMOS transistor, a gate of the fifth NMOS transistor and a gate of the sixth NMOS transistor are connected; a power terminal of the second buffer, a source of the third NMOS transistor, a source of the fourth NMOS transistor, a source of the fifth NMOS transistor and a source of the sixth NMOS transistor are connected at a connection terminal of a negative-voltage power supply terminal of the positive-to-negative voltage conversion circuit for connecting a negative voltage VEE; a ground terminal of the second buffer is grounded; a gate of the third PMOS transistor, and a drain of the third PMOS transistor and a gate of the seventh NMOS transistor are connected; a source of the seventh NMOS transistor is grounded; and an output terminal of the second buffer is an output terminal of the positive-to-negative voltage conversion circuit.

The first inverter includes a fourth PMOS transistor and an eighth NMOS transistor; a source of the fourth PMOS transistor is the power terminal of the first inverter, a gate of the fourth PMOS transistor is connected to a gate of the eighth NMOS transistor a connection terminal of the input terminal of the first inverter, and a drain of the fourth PMOS transistor is connected to a drain of the eighth NMOS transistor a connection terminal of the output terminal of the first inverter; and a source of the eighth NMOS transistor is the ground terminal of the first inverter.

The first buffer includes m second inverters, where m is an even number greater than or equal to 2; each of the second inverters has an input terminal, an output terminal, a power terminal and a ground terminal; the power terminals of the m second inverters are connected at a connection terminal of the power terminal of the first buffer; the ground terminals of the m second inverters are connected at a connection terminal of the ground terminal of the first buffer; and the input terminal of the first second inverter is the input terminal of the first buffer, the output terminal of the $n^{th}$ second inverter is connected to the input terminal of the $(n+1)^{th}$ second inverter, where n=1, 2, . . . , m−1, and the output terminal of the $m^{th}$ second inverter is the output terminal of the first buffer.

The second inverters have the same structure as the first inverter.

The second buffer includes k third inverters, where k is an even number greater than or equal to 2; each of the third inverters has an input terminal, an output terminal, a power terminal and a ground terminal; the power terminals of the k third inverters are connected at a connection terminal of the power terminal of the second buffer; the ground terminals of the k third inverters are connected at a connection terminal of the ground terminal of the second buffer; and the input terminal of the first third inverter is the input terminal of the second buffer, the output terminal of the $j^{th}$ third inverter is connected to the input terminal of the $(j+1)^{th}$ third inverter, where j=1, 2, . . . , k−1, and the output terminal of the $k^{th}$ third inverter is the output terminal of the second buffer.

The third inverters have the same structure as the first inverter.

A resistance value of the first resistor is equal to that of the second resistor; a resistance value of the third resistor is equal to that of the fourth resistor; the first PMOS transistor and the second PMOS transistor each have a width-to-length ratio of greater than or equal to 20; the first NMOS transistor has the same specification and model as the second NMOS; the third NMOS transistor has the same specification and model as the sixth NMOS; and the fourth NMOS transistor has the same specification and model as the fifth NMOS.

DESCRIPTION OF THE EMBODIMENTS

The present invention will be further described in details below in conjunction with the accompanying drawings and embodiments.

Figure 1:
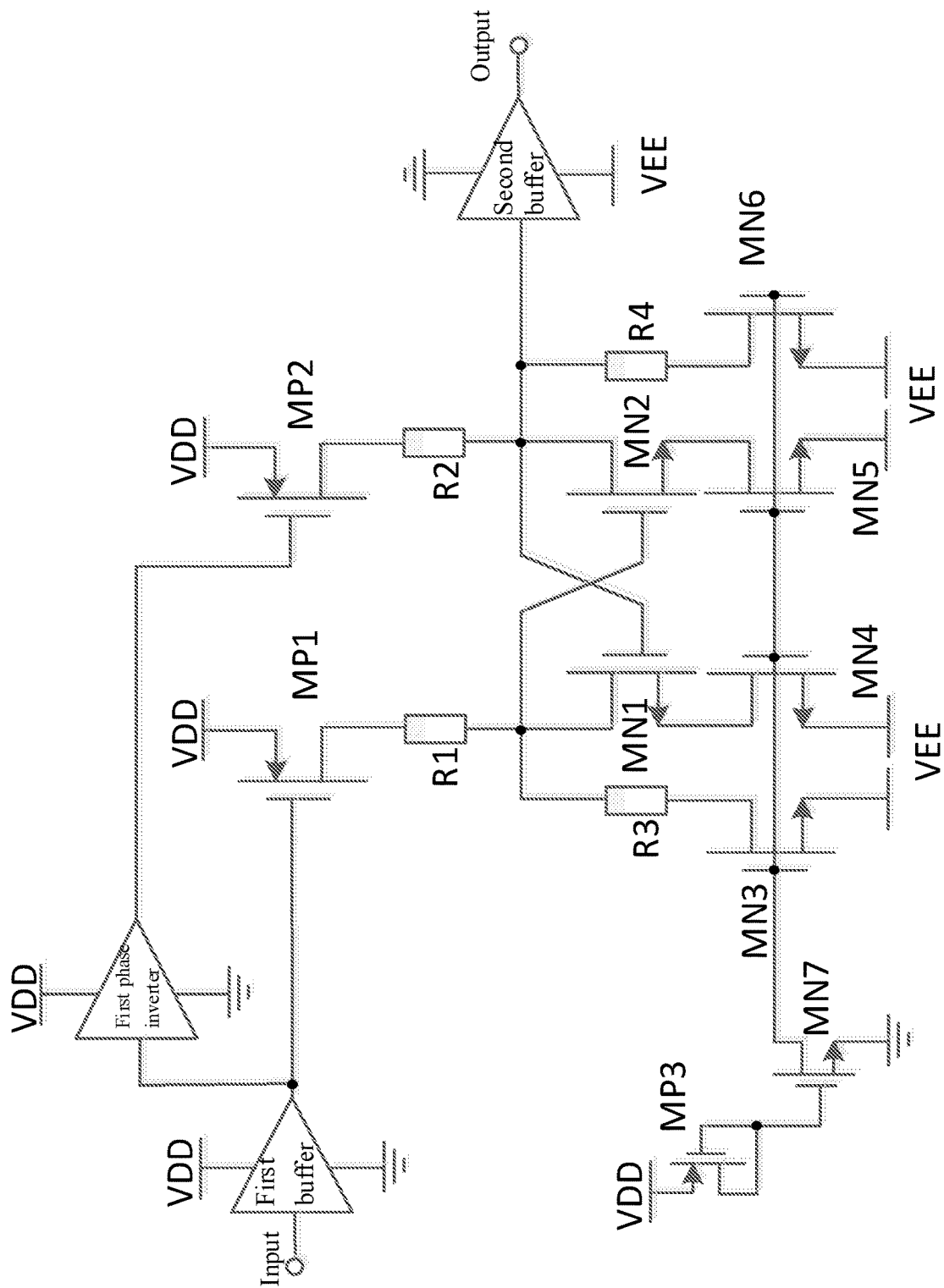
FIG. 1 shows a diagram of a highly reliably positive-to-negative voltage conversion circuit according to the present invention.

Embodiment I: As shown in FIG. 1, a highly reliable positive-to-negative voltage conversion circuit includes a first inverter, a first buffer, a second buffer, a first NMOS transistor MN1 MN1, a second NMOS transistor MN2 MN2, a third NMOS transistor MN3 MN3, a fourth NMOS transistor MN4, a fifth NMOS transistor MN5, a sixth NMOS transistor MN6, a seventh NMOS transistor MN7, a first PMOS transistor MP1, a second PMOS transistor MP2, a third PMOS transistor MP3, a first resistor R1, a second resistor R2, a third resistor R3, and a fourth resistor R4. The first inverter, the first buffer and the second buffer each has an input terminal, an output terminal, a power terminal and a ground terminal. The input terminal of the first buffer is a signal input terminal of the positive-to-negative voltage conversion circuit; the power terminal of the first buffer, the power terminal of the first inverter, a source of the first PMOS transistor MP1, a source of the second PMOS transistor MP2 and a source of the third PMOS transistor MP3 are connected at a connection terminal of a positive-voltage power supply terminal of the positive-to-negative voltage conversion circuit for connecting a positive voltage VDD. The ground terminal of the first buffer is grounded, and the output terminal of the first buffer is connected to the input terminal of the first inverter and a gate of the first PMOS transistor MP1, respectively. The ground terminal of the first inverter is grounded; and the output terminal of the first inverter is connected to a gate of the second PMOS transistor MP2. A drain of the first PMOS transistor MP1 is connected to a terminal of the first resistor R1, a drain of the second PMOS transistor MP2 is connected to a terminal of the second resistor R2, and the other terminal of the first resistor R1, a terminal of the third resistor R3, a drain of the first NMOS transistor MN1 and a gate of the second NMOS transistor MN2 are connected; the other terminal of the second resistor R2, a terminal of the fourth resistor R4, a drain of the second NMOS transistor MN2, a gate of the first NMOS transistor MN1 and an input terminal of the second buffer are connected; the other terminal of the third resistor R3 is connected to a drain of the third NMOS transistor MN3; the other terminal of the fourth resistor R4 is connected to a drain of the sixth NMOS transistor MN6; a source of the first NMOS transistor MN1 is connected to a drain of the fourth NMOS transistor MN4; a source of the second NMOS transistor MN2 is connected to a drain of the fifth NMOS transistor MN5; a drain of the seventh NMOS transistor MN7, a gate of the third NMOS transistor MN3, a gate of the fourth NMOS transistor MN4, a gate of the fifth NMOS transistor MN5 and a gate of the sixth NMOS transistor MN6 are connected; a power terminal of the second buffer, a source of the third NMOS transistor MN3, a source of the fourth NMOS transistor MN4, a source of the fifth NMOS transistor MN5 and a source of the sixth NMOS transistor MN6 are connected at a connection terminal of a negative-voltage power supply terminal of the positive-to-negative voltage conversion circuit for connecting a negative voltage VEE; a ground terminal of the second buffer is grounded, and a gate of the third PMOS transistor MP3, a drain of the third PMOS transistor MP3 and a gate of the seventh NMOS transistor MN7 are connected; a source of the seventh NMOS transistor MN7 is grounded; and an output terminal of the second buffer is an output terminal of the positive-to-negative voltage conversion circuit.

In this embodiment, the first PMOS transistor MP1 and the second PMOS transistor MP2 act as switching tubes; the width-to-length ratios of the first PMOS transistor MP1 and the second PMOS transistor MP2 determine their on resistance; if the on resistance of the first PMOS transistor MP1 and the second PMOS transistor MP2 is too high, the output of the converted level is affected; and if the on resistance is too low, a larger area needs to be occupied. Hence, the width-to-length ratios of the first PMOS transistor MP1 and the second PMOS transistor MP2 are greater than or equal to 20, which has no effect on the output of the converted level and can also reduce a chip area. The third PMOS transistor MP3, the third NMOS transistor MN3, the fourth NMOS transistor MN4, the fifth NMOS transistor MN5, the sixth NMOS transistor MN6 and the seventh NMOS transistor MN7 form an on/off control circuit for controlling the on/off of the power supply path between the positive-voltage power supply terminal and the negative-voltage power supply terminal. A circuit structure formed by the first resistor R1, third resistor R3, first NMOS transistor MN1, third NMOS transistor MN3 and fourth NMOS transistor MN4 and a circuit structure formed by the second resistor R2, fourth resistor R4, second NMOS transistor MN2, fifth NMOS transistor MN5 and sixth NMOS transistor MN6 form a differential circuit structure. Therefore, a resistance value of the first resistor R1 is equal to that of the second resistor R2; a resistance value of the third resistor R3 is equal to that of the fourth resistor R4; the first NMOS transistor MN1 has the same specification and model as the second NMOS MN2; the third NMOS transistor MN3 has the same specification and model as the sixth NMOS MN6; and the fourth NMOS transistor MN4 has the same specification and model as the fifth NMOS MN5.

The working principle of the highly-reliable positive-to-negative voltage conversion circuit in this embodiment is as follows.

When the power-on is completed on both the positive-voltage power supply terminal and the negative-voltage power supply terminal of the positive-to-negative voltage conversion circuit (that is, the positive-voltage power supply terminal is connected to the positive voltage VDD, and the negative-voltage power supply terminal is connected to the negative voltage VEE), the positive-to-negative voltage conversion circuit enters a normal operating state; if a low level is input to the signal input terminal of the positive-to-negative voltage conversion circuit, the gate of the first PMOS transistor MP1 is at a low level after the low level passes through the first buffer, and the gate of the second PMOS transistor MP2 is at a high level after the low level pass through the first inverter; at this point, the second PMOS transistor MP2 is turned off, the first PMOS transistor MP1 is turned on, the gate of the third PMOS transistor MP3 turns into a high level after the power-on is completed on the positive-voltage power supply terminal of the positive-to-negative voltage conversion circuit, and the seventh NMOS transistor MN7 is turned on; at this point, the gate of the third NMOS transistor MN3, the gate of the fourth NMOS transistor MN4, the gate of the fifth NMOS transistor MN5 and the gate of the sixth NMOS transistor MN6 are all pulled to a low level by the seventh NMOS transistor MN7, and thus are all turned on; at this point, a path formed by the first PMOS transistor MP1, the first resistor R1, the third resistor R3 and the third NMOS transistor MN3 are turned on, currents are produced in the first resistor R1 and the third resistor R3, a level determined by the partial voltages of the first resistor R1 and the third resistor R3 is given to the gate of the second NMOS transistor MN2, which is then turned on; and at this point, the input terminal of the second buffer is pulled down to the negative voltage VEE by the second NMOS transistor MN2, the fifth NMOS transistor MN5, the fourth resistor R4 and the sixth NMOS transistor MN6, the negative voltage VEE also acts on the gate of the first NMOS MN1 to thus turn off the first NMOS transistor MN1, and so far, the output terminal of the second buffer outputs a level of 0 V. If a high level is input to the signal input terminal of the positive-to-negative voltage conversion circuit, the gate of the first PMOS transistor MP1 is at a high level after the high level passes through the first buffer, the gate of the second PMOS transistor MP2 is at a low level after the high level passes through the first inverter, hence, the first PMOS transistor MP1 is turned off and the second PMOS transistor MP2 is turned on; at this point, a path formed by the second PMOS transistor MP2, the second resistor R2, the fourth resistor R4 and the sixth NMOS transistor MN6 is turned on, currents are produced in the second resistor R2 and the fourth resistor R4, a level determined by the partial voltages of the second resistor R2 and the fourth resistor R4 is given to the gate of the first NMOS transistor MN1, which is then turned on; at this point, the input terminal of the second buffer is driven by the partial voltages of the second resistor R2 and the fourth resistor R4, and the partial voltages also act on the gate of the first NMOS transistor MN1 to thus turn on the first NMOS transistor MN1; at this point, the gate of the second NMOS transistor MN2 is pulled down to the negative voltage VEE to thus turn off the second NMOS transistor MN2, and so far, the level at the input terminal of the second buffer is determined by the resistance values of the second and fourth resistor R2 and R4; and since the resistance value of the second resistor R2 is equal to that of the fourth resistor R4 and the input terminal of the second buffer is approximate to 0 V, the voltage at the output terminal of the second buffer is equal to the negative voltage VEE, and the positive-to-negative voltage conversion circuit then fulfills the voltage conversion function. When the positive-voltage power supply terminal of the positive-to-negative voltage conversion circuit is first powered on (that is, the positive-voltage power supply terminal is connected to the positive voltage VDD) and the negative-voltage power supply terminal is not powered on, the third PMOS transistor MP3 is turned on due to its drain which is connected to the positive voltage VDD; at this point, the voltage at the gate of the seventh NMOS transistor MN7 is at a high level, the drain of the seventh NMOS transistor MN7 is pulled to a low level, and has a voltage of 0 V; the gate of the third NMOS transistor MN3, the gate of the fourth NMOS transistor MN4, the gate of the fifth NMOS transistor MN5 and the gate of the sixth NMOS transistor MN6 each have a voltage of 0 V, and the third NMOS transistor MN3, the fourth NMOS transistor MN4, the fifth NMOS transistor MN5 and the sixth NMOS transistor MN6 are not turned on; and at this point, the power supply path between the positive-voltage power supply terminal and the negative-voltage power supply terminal is turned off, such that no reverse voltage is present at the negative-voltage power supply terminal.

If there is no on/off control circuit formed by the third PMOS transistor MP3, the third NMOS transistor MN3, the fourth NMOS transistor MN4, the fifth NMOS transistor MN5, the sixth NMOS transistor MN6 and the seventh NMOS transistor MN7, when the positive-voltage power supply terminal is first powered on and the negative-voltage power supply terminal is not powered on, a forward conduction path is present in at least one of the two paths in the first PMOS transistor MP1 and the second PMOS transistor MP2. For example, when the gate of the first PMOS transistor MP1 is at a low level, the first PMOS transistor MP1 is turned on, and the voltage at the drain of the first NMOS MN1 is gradually pulled down by means of the paths in the first resistor R1 and the third resistor R3; the second NMOS transistor MN2 just begins to be turned on, the drain of the second NMOS transistor MN2 is also gradually pulled down, until the voltage at the drain of the first NMOS transistor MN1 is close to its threshold voltage Vth; at this point, the voltage of the negative-voltage power supply terminal is reversed to be equal to Vth, and the second NMOS transistor MN2 is approximately turned off; and at this point, voltage reversing occurs to the negative-voltage power supply terminal.

Hence, in this embodiment, after the power-on is completed on both the positive-voltage power supply terminal and the negative-voltage power supply terminal of the positive-to-negative voltage conversion circuit, the third NMOS transistor MN3, the fourth NMOS transistor MN4, the fifth NMOS transistor MN5 and the sixth NMOS transistor MN6 are completely turned on, without affecting the level conversion function of the positive-to-negative voltage conversion circuit; and when the power-on at the positive-voltage power supply terminal of the positive-to-negative voltage conversion circuit is completed prior to that at the negative-voltage power supply terminal, the third NMOS transistor MN3, the fourth NMOS transistor MN4, the fifth NMOS transistor MN5 and the sixth NMOS transistor MN6 are not turned on; and at this point, no reverse voltage is present at the negative-voltage power supply terminal, where the power supply path between the positive-voltage power supply terminal and the negative-voltage power supply terminal is physically isolated by means of the on/off control circuit, which eliminates voltage reversing occurring when the positive-voltage power supply terminal and the negative-voltage power supply terminal cannot be synchronized during power-on.

Figure 2:
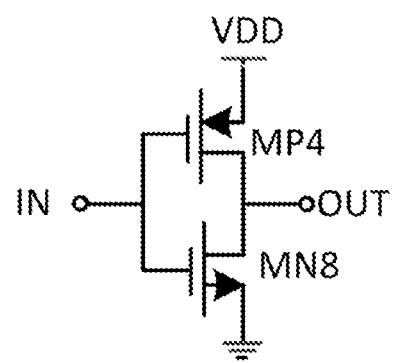
FIG. 2 shows a circuit diagram of a first inverter of the highly reliably positive-to-negative voltage conversion circuit according to the present invention.

Embodiment II: This embodiment is basically the same as Embodiment I, except that: as shown in FIG. 2, in this embodiment, the first phase inverter includes a fourth PMOS transistor MP4 and an eighth NMOS transistor MN8; the source of the fourth PMOS transistor MP4 is the power terminal of the first inverter, a gate of the fourth PMOS transistor MP4 is connected to a gate of the eighth NMOS transistor MN8 a connection terminal of the input terminal of the first inverter, and a drain of the fourth PMOS transistor MP4 is connected to a drain of the eighth NMOS transistor MN8 a connection terminal of the output terminal of the first inverter; and a source of the eighth NMOS transistor MN8 is the ground terminal of the first inverter.

Embodiment III: This embodiment is basically the same as Embodiment I, except that: in this embodiment, the first buffer includes m second inverters, where m is an even number greater than or equal to 2; each of the second inverters has an input terminal, an output terminal, a power terminal and a ground terminal; the power terminals of the m second inverters are connected at a connection terminal of the power terminal of the first buffer; the ground terminals of the m second inverters are connected at a connection terminal of the ground terminal of the first buffer; and the input terminal of the first second inverter is the input terminal of the first buffer, the output terminal of the $n^{th}$ second inverter is connected to the input terminal of the $(n+1)^{th}$ second inverter, where n=1, 2, . . . , m−1, and the output terminal of the $m^{th}$ second inverter is the output terminal of the first buffer. The second buffer includes k third inverters, where k is an even number greater than or equal to 2; each of the third inverters has an input terminal, an output terminal, a power terminal and a ground terminal; the power terminals of the k third inverters are connected at a connection terminal of the power terminal of the second buffer; the ground terminals of the k third inverters are connected at a connection terminal of the ground terminal of the second buffer; and the input terminal of the first third inverter is the input terminal of the second buffer, the output terminal of the $j^{th}$ third inverter is connected to the input terminal of the $(j+1)^{th}$ third inverter, where j=1, 2, . . . , k−1, and the output terminal of the $k^{th}$ third inverter is the output terminal of the second buffer. The second inverters have the same structure as the first inverter. The third inverters have the same structure as the first inverter.

Compared with the prior art, the present invention has the following advantages. The highly reliable positive-to-negative voltage conversion circuit is formed by the first inverter, the first buffer, the second buffer, the first NMOS transistor, the second NMOS transistor, the third NMOS transistor, the fourth NMOS transistor, the fifth NMOS transistor, the sixth NMOS transistor, the seventh NMOS transistor, the first PMOS transistor, the second PMOS transistor, the third PMOS transistor, the first resistor, the second resistor, the third resistor, and the fourth resistor. The third PMOS transistor, the third NMOS transistor, the fourth NMOS transistor, the fifth NMOS transistor, the sixth NMOS transistor and the seventh NMOS transistor form an on/off control circuit for controlling the on/off of a power supply path between a positive-voltage power supply terminal and the negative-voltage power supply terminal; the first PMOS transistor and the second PMOS transistor act as switching tubes to guarantee the normal output of a converted level; and the first resistor, third resistor, first NMOS transistor, third NMOS transistor and fourth NMOS transistor and the second resistor, fourth resistor, second NMOS transistor, fifth NMOS transistor and sixth NMOS transistor form a differential circuit structure. When the positive-voltage power supply terminal of the positive-to-negative voltage conversion circuit is first powered on (that is, the positive-voltage power supply terminal is connected to the positive voltage VDD) and the negative-voltage power supply terminal is not powered on, the third PMOS transistor is turned on due to its drain which is connected to the positive voltage VDD; at this point, the voltage at the gate of the seventh NMOS transistor is at a high level, the drain of the seventh NMOS transistor is pulled to a low level, and has a voltage of 0 V; meanwhile, the gate of the third NMOS transistor, the gate of the fourth NMOS transistor, the gate of the fifth NMOS transistor and the gate of the sixth NMOS transistor each have a voltage of 0 V, and the third NMOS transistor, the fourth NMOS transistor, the fifth NMOS transistor and the sixth NMOS transistor are not turned on; and at this point, the power supply path between the positive-voltage power supply terminal and the negative-voltage power supply terminal is turned off, such that no reverse voltage is present at the negative-voltage power supply terminal. When the negative-voltage power supply terminal of the positive-to-negative voltage conversion circuit is also powered on following the power-on of the positive-voltage power supply terminal (that is, the negative-voltage power supply terminal is connected to the negative voltage VEE), both the positive-voltage power supply terminal and the negative-voltage power supply terminal of the positive-tonegative voltage conversion circuit are powered on, and the positive-to-negative voltage conversion circuit enters a normal operating state; if a low level is input to the signal input terminal of the positive-to-negative voltage conversion circuit, the gate of the first PMOS transistor is at a low level after the low level passes through the first buffer, and the gate of the second PMOS transistor is at a high level after the low level pass through the first inverter; at this point, the second PMOS transistor is turned off, the first PMOS transistor is turned on, the gate of the third PMOS transistor turns into a high level after the power-on is completed on the positive-voltage power supply terminal of the positive-to-negative voltage conversion circuit, and the seventh NMOS transistor is turned on; at this point, the gate of the third NMOS transistor, the gate of the fourth NMOS transistor, the gate of the fifth NMOS transistor and the gate of the sixth NMOS transistor are all pulled to a low level by the seventh NMOS transistor, and thus are all turned on; at this point, a path formed by the first PMOS transistor, the first resistor, the third resistor and the third NMOS transistor are turned on, currents are produced in the first resistor and the third resistor, a level determined by the partial voltages of the first resistor and the third resistor is given to the gate of the second NMOS transistor, which is then turned on; and at this point, the input terminal of the second buffer is pulled down to the negative voltage VEE by the second NMOS transistor, the fifth NMOS transistor, the fourth resistor and the sixth NMOS transistor, the negative voltage VEE also acts on the gate of the first NMOS to thus turn off the first NMOS transistor, and so far, the output terminal of the second buffer outputs a level of 0 V. If a high level is input to the signal input terminal of the positive-to-negative voltage conversion circuit, the gate of the first PMOS transistor is at a high level after the high level passes through the first buffer, the gate of the second PMOS transistor is at a low level after the high level passes through the first inverter, hence, the first PMOS transistor is turned off and the second PMOS transistor is turned on; at this point, a path formed by the second PMOS transistor, the second resistor, the fourth resistor and the sixth NMOS transistor is turned on, currents are produced in the second resistor and the fourth resistor, a level determined by the partial voltages of the second resistor and the fourth resistor is given to the gate of the first NMOS transistor, which is then turned on; at this point, the input terminal of the second buffer is driven by the partial voltages of the second resistor and the fourth resistor, and the partial voltages also act on the gate of the first NMOS transistor to thus turn on the first NMOS transistor; at this point, the gate of the second NMOS transistor is pulled down to the negative voltage VEE to thus turn off the second NMOS transistor, and so far, the level at the input terminal of the second buffer is determined by the resistance values of the second and fourth resistors; and since the resistance value of the second resistor is equal to that of the fourth resistor and the input terminal of the second buffer is approximate to 0 V, the voltage at the output terminal of the second buffer is equal to the negative voltage VEE, and the positive-to-negative voltage conversion circuit then fulfills the voltage conversion function. In the present invention, the first PMOS transistor, the third NMOS transistor, the fourth NMOS transistor, the fifth NMOS transistor, the sixth NMOS transistor and the seventh NMOS transistor form the on/off control circuit; after the power-on is completed on both the positive-voltage power supply terminal and the negative-voltage power supply terminal of the positive-to-negative voltage conversion circuit, the third NMOS transistor, the fourth NMOS transistor, the fifth NMOS transistor and the sixth NMOS transistor are completely turned on, without affecting the level conversion function of the positive-to-negative voltage conversion circuit; and when the power-on at the positive-voltage power supply terminal of the positive-to-negative voltage conversion circuit is completed prior to that at the negative-voltage power supply terminal, the third NMOS transistor, the fourth NMOS transistor, the fifth NMOS transistor and the sixth NMOS transistor are not turned on, and at this point, no reverse voltage is present at the negative-voltage power supply terminal. Hence, the present invention physically isolates the power supply path between the positive-voltage power supply terminal and the negative-voltage power supply terminal of the positive-to-negative voltage conversion circuit by means of the on/off control circuit to eliminate voltage reversing occurring when the positive-voltage power supply terminal and the negative-voltage power supply terminal cannot be synchronized during power-on, thereby avoiding bringing application risks to a negative-voltage power supply application circuit at a later stage.

What is claimed is:

1. A highly reliable positive-to-negative voltage conversion circuit, wherein the highly reliable positive-to-negative voltage conversion circuit comprises a first inverter, a first buffer, a second buffer, a first N-type metal-oxide-silicon (NMOS) transistor, a second NMOS transistor, a third NMOS transistor, a fourth NMOS transistor, a fifth NMOS transistor, a sixth NMOS transistor, a seventh NMOS transistor, a first P-type metal-oxide-silicon (PMOS) transistor, a second PMOS transistor, a third PMOS transistor, a first resistor, a second resistor, a third resistor, and a fourth resistor, wherein the first inverter, the first buffer and the second buffer each has an input terminal, an output terminal, a power terminal and a ground terminal; the input terminal of the first buffer is a signal input terminal of the positive-to-negative voltage conversion circuit; the power terminal of the first buffer, the power terminal of the first inverter, a source of the first PMOS transistor, a source of the second PMOS transistor and a source of the third PMOS transistor are connected at a connection terminal of a positive-voltage power supply terminal of the positive-to-negative voltage conversion circuit for connecting to a positive voltage; the ground terminal of the first buffer is grounded, and the output terminal of the first buffer is connected to the input terminal of the first inverter and a gate of the first PMOS transistor, respectively; the ground terminal of the first inverter is grounded, and the output terminal of the first inverter is connected to a gate of the second PMOS transistor; a drain of the first PMOS transistor is connected to a terminal of the first resistor, a drain of the second PMOS transistor is connected to a terminal of the second resistor, and the other terminal of the first resistor, a terminal of the third resistor, a drain of the first NMOS transistor and a gate of the second NMOS transistor are connected; the other terminal of the second resistor, a terminal of the fourth resistor, a drain of the second NMOS transistor, a gate of the first NMOS transistor and an input terminal of the second buffer are connected; the other terminal of the third resistor is connected to a drain of the third NMOS transistor; the other terminal of the fourth resistor is connected to a drain of the sixth NMOS transistor; a source of the first NMOS transistor is connected to a drain of the fourth NMOS transistor; a source of the second NMOS transistor is connected to a drain of the fifth NMOS transistor; a drain of the seventh NMOS transistor, a gate of the third NMOS transistor, a gate of the fourth NMOS transistor, a gate of the fifth NMOS transistor and a gate of the sixth NMOS transistor are connected; a power terminal of the second buffer, a source of the third NMOS transistor, a source of the fourth NMOS transistor, a source of the fifth NMOS transistor and a source of the sixth NMOS transistor are connected at a connection terminal of a negative-voltage power supply terminal of the positive-to-negative voltage conversion circuit for connecting a negative voltage; a ground terminal of the second buffer is grounded; a gate of the third PMOS transistor, and a drain of the third PMOS transistor and a gate of the seventh NMOS transistor are connected; a source of the seventh NMOS transistor is grounded; and an output terminal of the second buffer is an output terminal of the positive-to-negative voltage conversion circuit.

2. The highly reliable positive-to-negative voltage conversion circuit according to claim 1, wherein the first inverter comprises a fourth PMOS transistor and an eighth NMOS transistor; a source of the fourth PMOS transistor is the power terminal of the first inverter, a gate of the fourth PMOS transistor is connected to a gate of the eighth NMOS transistor, a connection terminal of the input terminal of the first inverter, and a drain of the fourth PMOS transistor is connected to a drain of the eighth NMOS transistor, a connection terminal of the output terminal of the first inverter; and a source of the eighth NMOS transistor is the ground terminal of the first inverter.

3. The highly reliable positive-to-negative voltage conversion circuit according to claim 1, wherein the first buffer comprises m second inverters, where m is an even number greater than or equal to 2; each of the second inverters has an input terminal, an output terminal, a power terminal and a ground terminal; the power terminals of the m second inverters are connected at a connection terminal of the power terminal of the first buffer; the ground terminals of the m second inverters are connected at a connection terminal of the ground terminal of the first buffer; and the input terminal of the first second inverter is the input terminal of the first buffer, the output terminal of the $n^{th}$ second inverter is connected to the input terminal of the $(n+1)^{th}$ second inverter, where n is a natural number smaller than m, and the output terminal of the $m^{th}$ second inverter is the output terminal of the first buffer.

4. The highly reliable positive-to-negative voltage conversion circuit according to claim 3, wherein the second inverters have the same structure as the first inverter.

5. The highly reliable positive-to-negative voltage conversion circuit according to claim 1, wherein the second buffer comprises k third inverters, where k is an even number greater than or equal to 2; each of the third inverters has an input terminal, an output terminal, a power terminal and a ground terminal; the power terminals of the k third inverters are connected at a connection terminal of the power terminal of the second buffer; the ground terminals of the k third inverters are connected at a connection terminal of the ground terminal of the second buffer; and the input terminal of the first third inverter is the input terminal of the second buffer, the output terminal of the $j^{th}$ third inverter is connected to the input terminal of the $(j+1)^{th}$ third inverter, where j=is a natural number smaller than k, and the output terminal of the $k^{th}$ third inverter is the output terminal of the second buffer.

6. The highly reliable positive-to-negative voltage conversion circuit according to claim 5, wherein the third inverters have the same structure as the first inverter.

7. The highly reliable positive-to-negative voltage conversion circuit according to claim 1, wherein a resistance value of the first resistor is equal to that of the second resistor; a resistance value of the third resistor is equal to that of the fourth resistor; the first PMOS transistor and the second PMOS transistor each have a width-to-length ratio of greater than or equal to 20; the first NMOS transistor has the same specification and model as the second NMOS; the third NMOS transistor has the same specification and model as the sixth NMOS; and the fourth NMOS transistor has the same specification and model as the fifth NMOS.

\* \* \* \* \*